United States Patent
Bai

(10) Patent No.: US 9,557,362 B2
(45) Date of Patent: Jan. 31, 2017

(54) METHOD AND MEANS FOR CONTACTOR MONITORING IN ELECTRIC VEHICLE SUPPLY EQUIPMENT

(75) Inventor: Ming Bai, Redondo Beach, CA (US)

(73) Assignee: AeroVironment, Inc., Monrovia, CA (US)

( * ) Notice: Subject to any disclaimer, the term of this patent is extended or adjusted under 35 U.S.C. 154(b) by 0 days.

(21) Appl. No.: 14/342,312

(22) PCT Filed: Aug. 30, 2012

(86) PCT No.: PCT/US2012/053219
§ 371 (c)(1),
(2), (4) Date: Sep. 8, 2014

(87) PCT Pub. No.: WO2013/033454
PCT Pub. Date: Mar. 7, 2013

(65) Prior Publication Data
US 2015/0032313 A1    Jan. 29, 2015

Related U.S. Application Data

(60) Provisional application No. 61/529,217, filed on Aug. 30, 2011.

(51) Int. Cl.
*G01R 31/00* (2006.01)
*G01R 31/327* (2006.01)

(52) U.S. Cl.
CPC ......... *G01R 31/007* (2013.01); *G01R 31/3277* (2013.01)

(58) Field of Classification Search
CPC ........................... G01R 31/007; G01R 31/3277
(Continued)

(56) References Cited

U.S. PATENT DOCUMENTS

| | | |
|---|---|---|
| 4,090,114 A | 5/1978 | Thompson et al. |
| 5,369,540 A | 11/1994 | Konrad et al. |

(Continued)

FOREIGN PATENT DOCUMENTS

| | | |
|---|---|---|
| TW | 201112536 A | 4/2011 |
| TW | I282433 B | 6/2011 |
| WO | WO9323760 A1 | 11/1993 |

OTHER PUBLICATIONS

The State Intellectual Property Office of the People'S Republic of China (SIPO); First Office Action (1OA) for related Chinese case application No. 201280053806.6, entitled Method and means for contactor monitoring in electric vehicle supply equipment by Ming Bai, Issued Sep. 18, 2015 from The State Intellectual Property Office of the People's Republic of China, 12 pgs.

(Continued)

*Primary Examiner* — Marthe Marc-Coleman
(74) *Attorney, Agent, or Firm* — Christopher R. Balzan; Eric J. Aagaard

(57) ABSTRACT

In one implementation, a method is provided for contactor monitoring and control in electric vehicle supply equipment, which includes updating an open error count and a close error count based on a detected condition of the contactor. The method also includes determining a detected state of the contactor by comparing the open error count and the close error count to maximum and minimum values. The method further includes performing at least one of controlling the state of the contactor based on the determined contactor state, or providing a visual indicator based on the determined contactor state.

20 Claims, 8 Drawing Sheets

(58) Field of Classification Search
USPC .......... 701/22; 320/134, 109; 324/511, 418; 361/23
See application file for complete search history.

(56) References Cited

U.S. PATENT DOCUMENTS

| | | | |
|---|---|---|---|
| 8,633,678 B2* | 1/2014 | Yegin et al. ................ | 320/134 |
| 8,723,477 B2 | 5/2014 | Gaul et al. | |
| 2003/0080746 A1 | 5/2003 | Imai et al. | |
| 2003/0132752 A1 | 7/2003 | Johnson et al. | |
| 2009/0201027 A1 | 8/2009 | Sexton et al. | |
| 2010/0110593 A1 | 5/2010 | Kim et al. | |
| 2011/0279082 A1 | 11/2011 | Hagenmaier, Jr. et al. | |
| 2012/0105065 A1 | 5/2012 | Namou et al. | |
| 2014/0015487 A1* | 1/2014 | Brown et al. ................ | 320/109 |

OTHER PUBLICATIONS

International Searching Authority; International Search Report (ISR) for corresponding PCT case application No. PCT/US2012/053219 entitled Method and Means for Contactor Monitoring in Electric Vehicle Supply Equipment by Ming Bai.; mailed Nov. 26, 2012 from US International Searching Authority; 2 pgs.

International Searching Authority; Written Opinion of the International Searching Authority (WO) for corresponding PCT case application No. PCT/US2012/053219 entitled Method and Means for Contactor Monitoring in Electric Vehicle Supply Equipment by Ming Bai.; mailed Nov. 26, 2012 from US International Searching Authority; 10 pgs.

International Searching Authority; Examiner's Search History for corresponding PCT case application No. PCT/US2012/053219 entitled Method and Means for Contactor Monitoring in Electric Vehicle Supply Equipment by Ming Bai.; mailed Nov. 26, 2012 from US International Searching Authority; 5 pgs.

Taiwan Intellectual Property Office (TIPO); First Office Action (1OA) for corresponding Taiwan case application No. 101131593, entitled Method and means for contactor monitoring in electric vehicle supply equipment by Ming Bai, Issued Apr. 18, 2016 from Taiwan Intellectual Property Office, 9 pgs.

Taiwan Intellectual Property Office (TIPO); First Office Action Search Report (Search_Rpt) for corresponding Taiwan case application No. 101131593, entitled Method and means for contactor monitoring in electric vehicle supply equipment by Ming Bai, Issued Mar. 17, 2016 from Taiwan Intellectual Property Office, 1 pg.

* cited by examiner

US 9,557,362 B2

METHOD AND MEANS FOR CONTACTOR MONITORING IN ELECTRIC VEHICLE SUPPLY EQUIPMENT

CROSS REFERENCE TO RELATED APPLICATION

The present application claims the benefit of the U.S. Provisional Application 61/529,217, by Ming Bai, filed Aug. 30, 2011, entitled METHOD AND MEANS FOR CONTACTOR MONITORING IN ELECTRIC VEHICLE SUPPLY EQUIPMENT. herein incorporated by reference in its entirety.

BACKGROUND

A contactor is the major electrical component in an electric vehicle supply equipment or EVSE. Due to possible mechanical failure of the contactor and/or the electrical control circuit problem, especially under EMI, ESD, and other severe conditions, the contactor could potentially be stuck open or stuck close. When stuck open, the electric vehicle or EV will not be charged as commanded, when stuck close, current will be continuously provided to the EV unexpectedly, which could present a safety hazzard to the user.

What is needed is a means to monitor the contactor and ensure reliable indications of the proper functioning of the contactor. Further, what is needed is a implementable method to constantly monitor the state of the contactor.

SUMMARY

In one implementation, a method is provided for contactor monitoring and control in electric vehicle supply equipment, which includes updating an open error count and a close error count based on a detected condition of the contactor. The method also includes determining a detected state of the contactor by comparing the open error count and the close error count to maximum and minimum values. The method further includes performing at least one of controlling the state of the contactor based on the determined contactor state, or providing a visual indicator based on the determined contactor state.

BRIEF DESCRIPTION OF THE DRAWINGS

The features and advantages of the present invention will be better understood with regard to the following description, appended claims, and accompanying drawings where:

DESCRIPTION

In some implementations, the electric vehicle supply equipment or EVSE contactor monitoring is a method capable of being implemented in a state machine, programmed in software and executed with a programmable state machine such as a microcontroller, or programmed in a general-purpose software-programmable state machine such as a microprocessor, or the like. As discussed herein, a state machine and state machine functions or logic may be implemented in logic circuits, microcontrollers, microprocessors, or the like.

Figure 1:
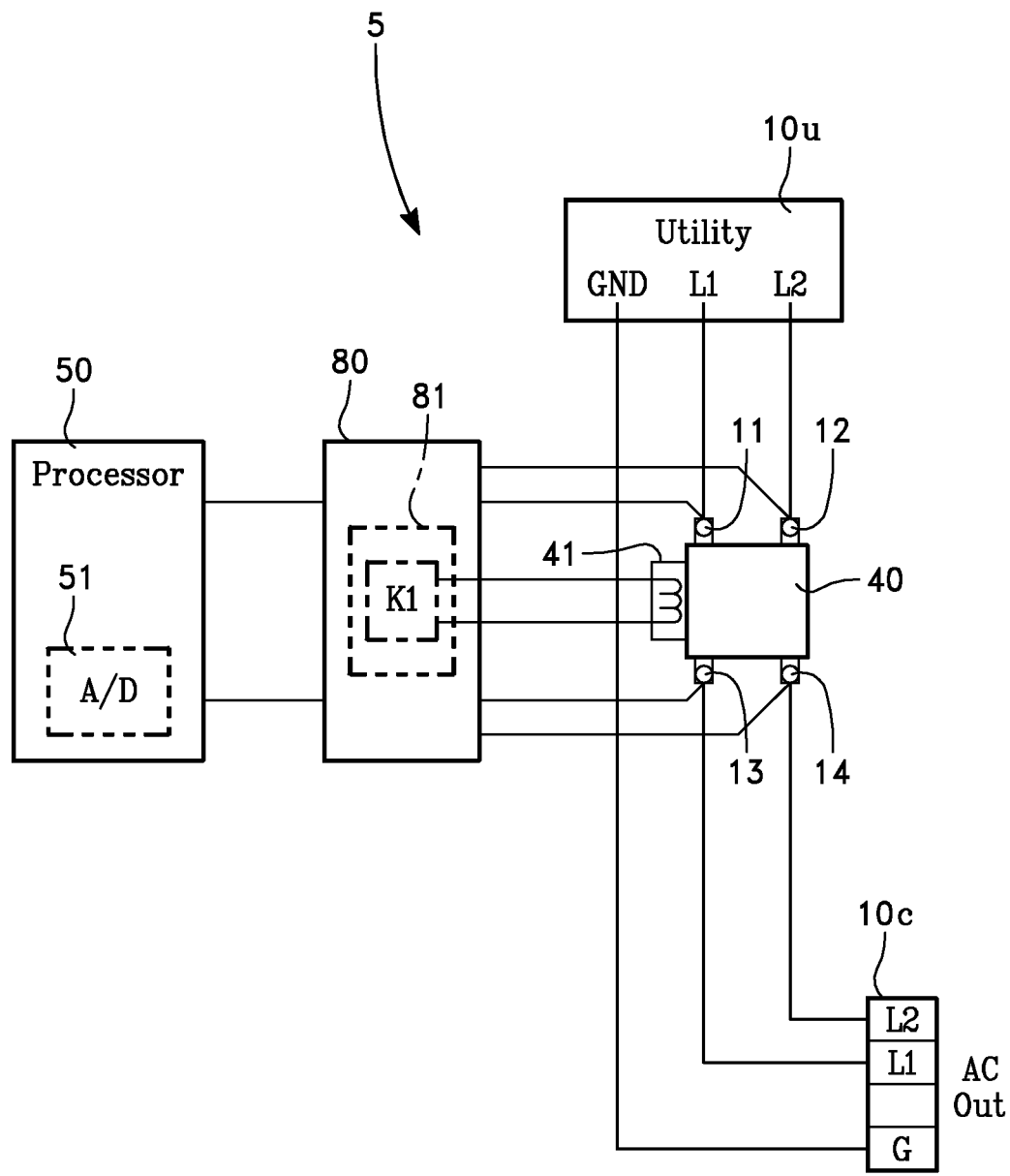
FIG. 1 shows a simplified block diagram of an example of an electric vehicle supply equipment capable of providing a means for implementing various implementations of the method for contactor monitoring.

FIG. 1 shows a simplified block diagram of an example of an electric vehicle supply equipment 5 capable of providing a means for implementing various implementations of the method for contactor monitoring. In FIG. 1, utility power 10u is supplied to an AC output connector 10c via a contactor 40. The contactor 40 applies the L1 and L2 utility power when energized by the utility power circuitry 80. The utility power circuitry 80 contains contactor control circuitry (not shown) and is responsive to control signals from the microprocessor 50 to open and close the contactor 40. The microprocessor 50 and power circuitry 80 function as a controller for contactor 40 monitoring and control, so can be a means for monitoring and controlling the contactor 40.

The L1 and L2 line voltages, Vin1 and Vin2 at a contactor 40 inputs 11 and 12, and the output voltages Vout1 and Vout2 at contactor outputs 13 and 14, are detected by the utility power circuitry 80, optionally converted to logic levels in the utility power circuitry 80, and sensed by an A/D converter 51. The A/D converter 51 may be stand alone, or part of the processor 50 as shown.

Contactor control circuitry 81, which may include a contactor control relay K1, may be included in, or separate from, the utility power circuitry 80. The contactor control relay K1 opens/closes the contactor 40 to disconnect/connect the utility power L1 and L2 from/to the vehicle connector 10c. In various embodiments, the contactor control relay 81 is connected to the contactor coil 41 to disconnect/connect the utility power L1 and L2 from/to the vehicle connector 10c. Example contactor control circuitry is disclosed in PCT Application PCT/US2011/048298 designating the U.S., entitled GROUND FAULT INTERRUPT AUTOMATIC TEST METHOD FOR ELECTRIC VEHICLE, by Albert Flack, filed Aug. 18, 2011, herein incorporated by referenced in its entirety.

In one implementation, the current method uses the sensed input voltages of Vin1 and Vin2, and the sensed output voltages of Vout1 and Vout2 of the A/D converter 51, and compares them with predefined thresholds to determine the instantaneous status, i.e. opened or closed, of the contactor 40. An Open Error Count and a Close Error Count are implemented to integrate possible errors over time and eventually determine the steady state, i.e. open, close, or unknown, of the contactor 40. If any state change detected, the new state will be reported to the main controller state machine, processor 50 in the embodiment show. Depending on the state is detected, processor 50 can command the contactor 40 to open or close accordingly.

Additional details of the contactor control and monitoring circuitry is included in PCT Application PCT/US2011/033134, by Albert Flack, filed 19 Apr. 2011, entitled CONTACTOR HEALTH MONITOR CIRCUIT AND METHOD, herein incorporated by reference in its entirety.

Figure 2:
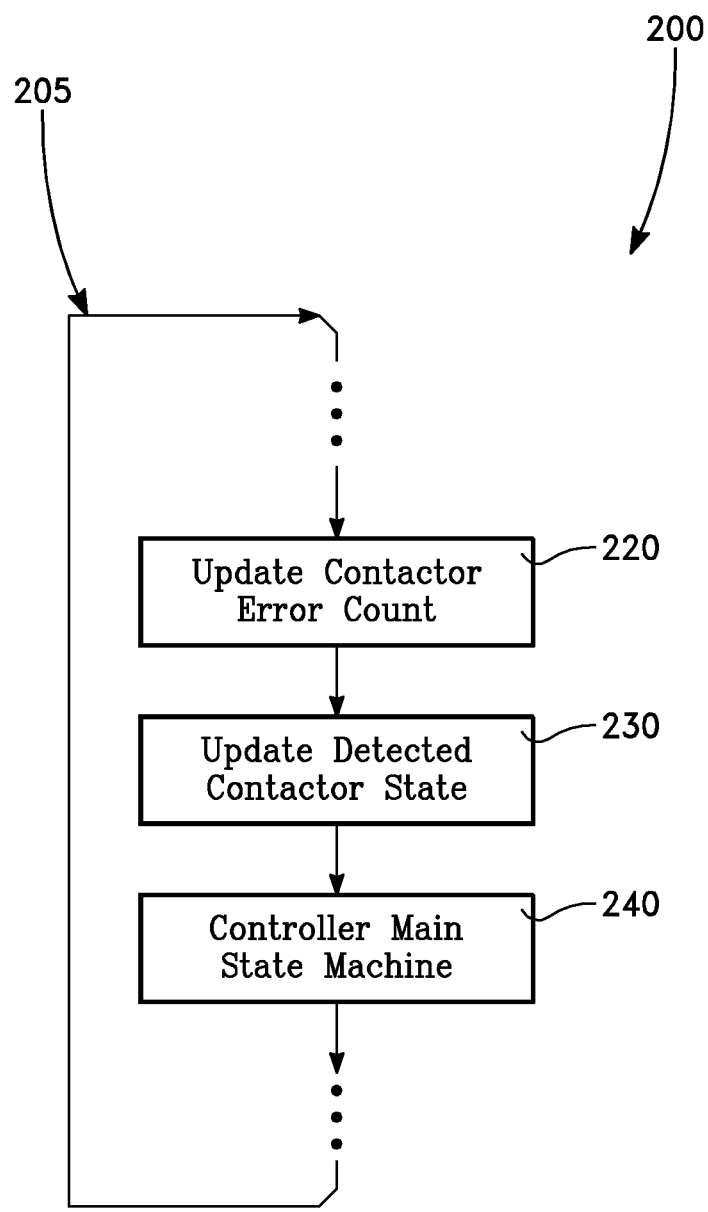
FIG. 2 shows a simplified flow chart diagram of an implementation of the contactor monitoring function.

FIG. 2 shows a simplified flow chart diagram of an implementation of the contactor monitoring function 200. In this implementation, there are three sections running in a main loop 205, the update contactor error count section 220, the update detected contactor state section 230, and the controller main state machine section 240.

Figure 3A:
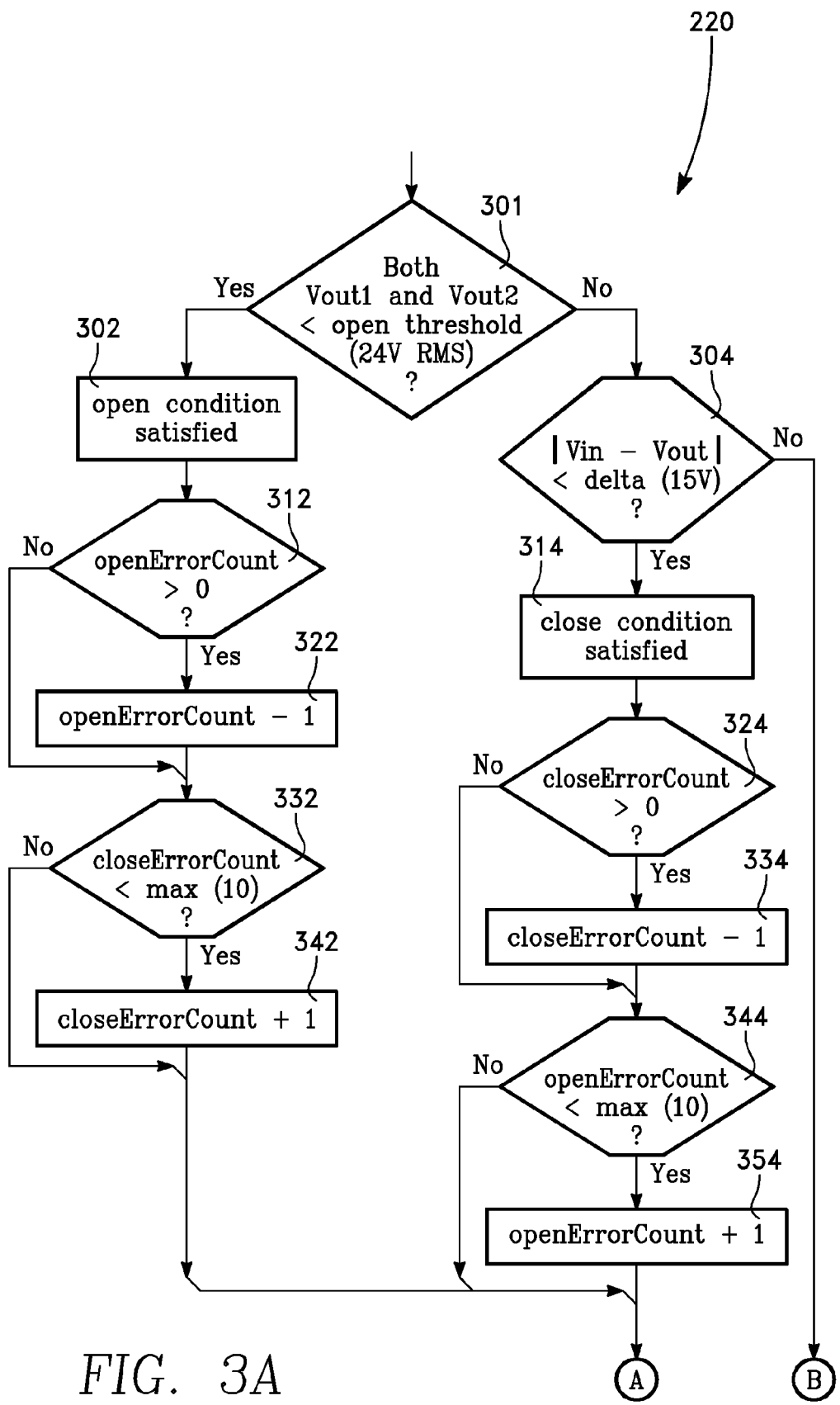
FIGS. 3A and 3B is a simplified flow chart diagram of an implementation of the update contactor error count section of FIG. 2.
Figure 3B:
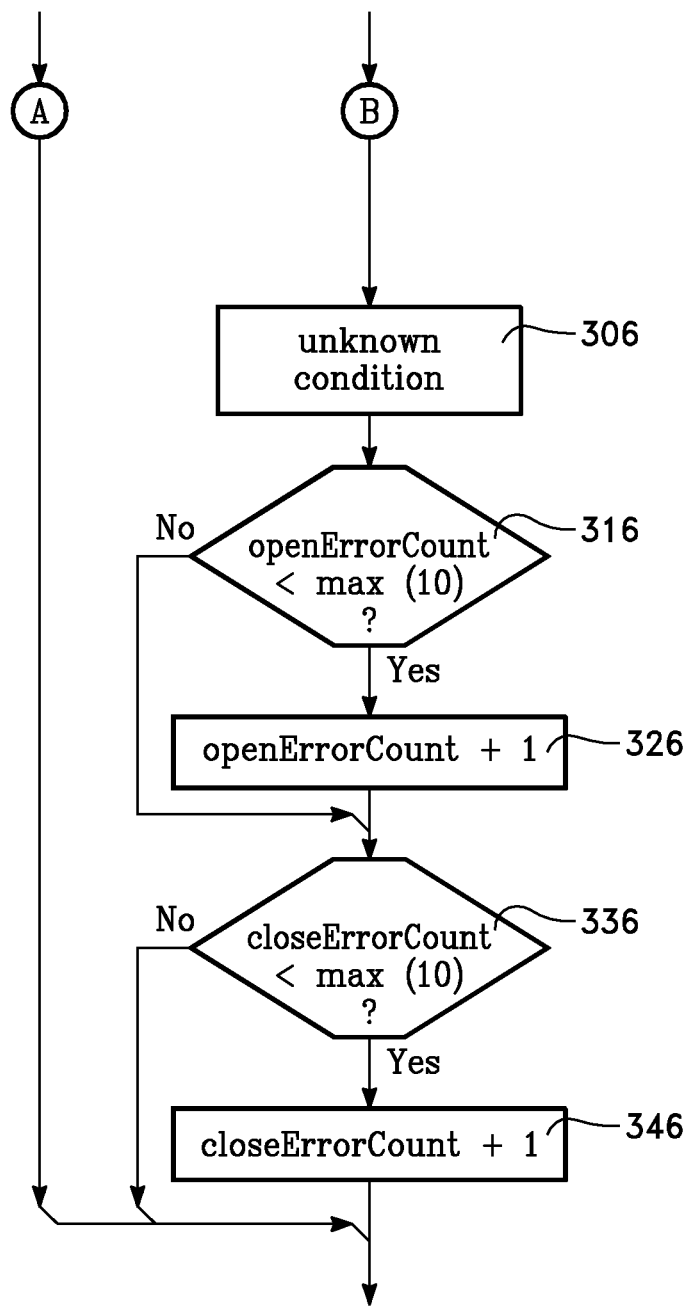

Shown in FIGS. 3A and 3B is a simplified flow chart diagram of an implementation of the update contactor error count section 220. In the update error count section, two error counts are used. They are the openErrorCount and the closeErrorCount. The openErrorCount counts the contactor open error (initialized as 0). If contactor open condition is not satisfied, this count increased by 1. The closeErrorCount counts the contactor close error (initialized as max=10). If contactor close condition is not satisfied, this count increased by 1.

With reference to FIGS. 3A and 3B, in block 301 if both Vout1 and Vout2 are less than an open threshold voltage, for example 24 RMS, the open condition is satisfied 302. If it is determined that the open condition is satisfied 302, and the openErrorCount is greater than zero at block 312, one is subtracted from the value of the openErrorCount at block 322. If the openErrorCount is not greater than zero at block 312, or after one is subtracted from the value of the openErrorCount at block 322, the closeErrorCount is then compared to a maximum value, i.e. ten, at block 332. If the closeErrorCount is less than the maximum value, for example ten, the closeErrorCount incremented up by one at block 342. If the closeErrorCount is not less than the maximum value, i.e. ten, at block 332, then block 342 is bypassed and the closeErrorCount is not incremented.

If at block 301 both Vout1 and Vout2 are not less than an open threshold voltage, the absolute value of Vin minus Vout is compared to a delta value, for example 15V, at block 304. If the absolute value of Vin minus Vout is less than a delta value, the close condition is satisfied at block 314 and if the absolute value of Vin minus Vout is not less than the delta value at 304, an unknown condition is satisfied at block 306. In various implementations, Vin and Vout are calculated using a least mean square curve fitting. This can provide less error for the error counting described herein as compared to using a root mean square curve fitting to calculate Vin and Vout.

When the close condition is satisfied at 314, and if the closeErrorCount is greater than zero at block 324, then the closeErrorCount is decremented by 1 at block 334. Also the closeErrorCount is decremented by 1 at block 334, or if the closeErrorCount is not greater than zero at block 324, the openErrorCount is compared at block 344 to the max value, i.e. ten. If at block 344 the openErrorCount is less than the max value, i.e. ten, the openErrorCount is incremented by one at block 354.

If at block 304 the absolute value of Vin minus Vout is not less than a delta value, i.e. 15V, the state of the contactor is in an unknown condition, shown at block 306 in FIG. 3B. When the unknown condition is satisfied 306, if the openErrorCount is less than a maximum value, i.e. ten, at block 316, the openErrorCount is incremented by one at block 326. After the openErrorCount is incremented by one at block 326, or if the openErrorCount is not less than the maximum, then the closeErrorCount is compared the mixi-mum value, i.e. ten. If the closeErrorCount is less than the maximum value, the closeErrorCount is incremented by one at block 346. If the closeErrorCount is not less than the maximum value, the closeErrorCount is not incremented.

Figure 4A:
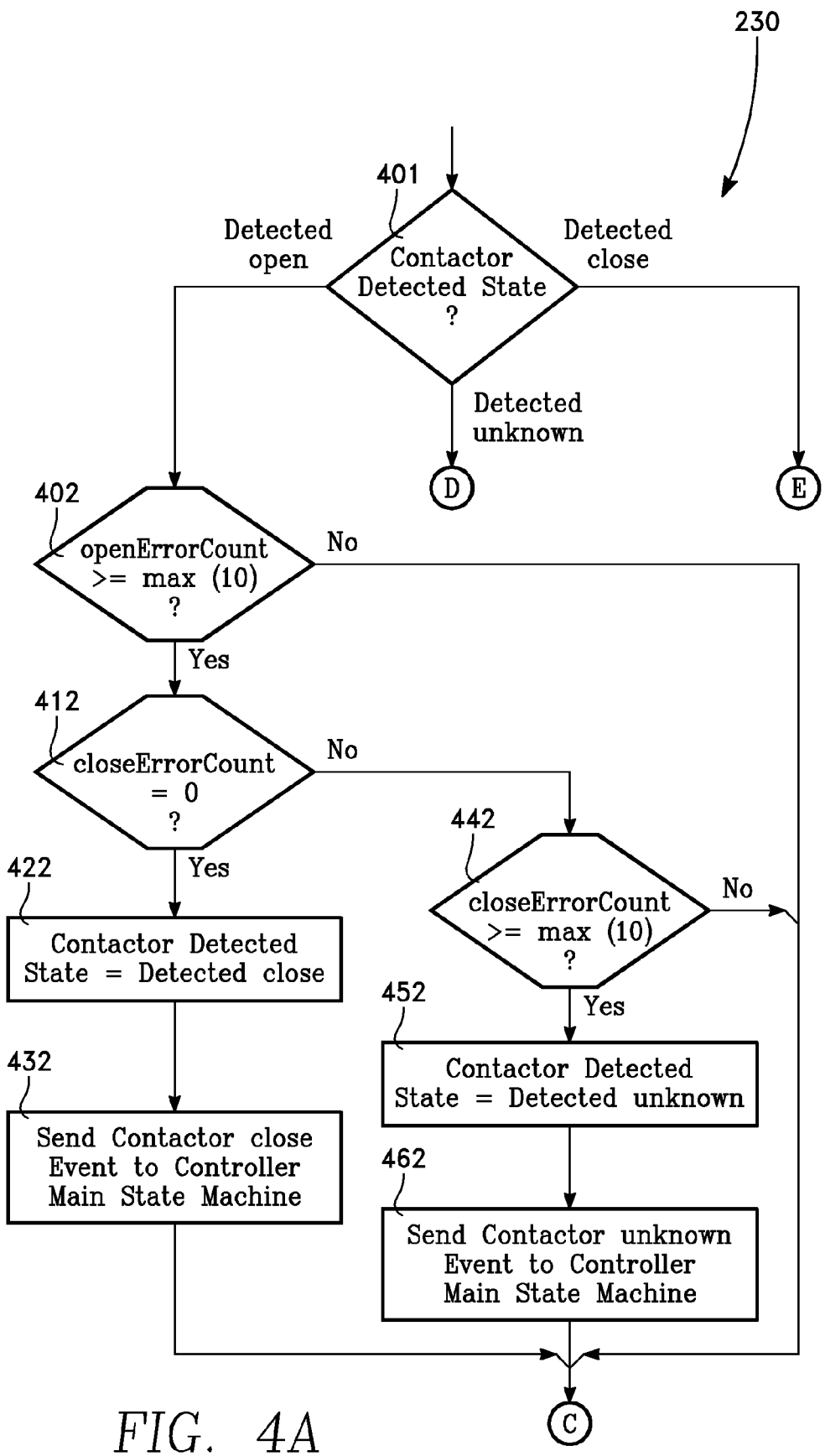
FIGS. 4A through 4C is a simplified flow chart diagram of an implementation of the update detected contactor state of FIG. 2.
Figure 4B:
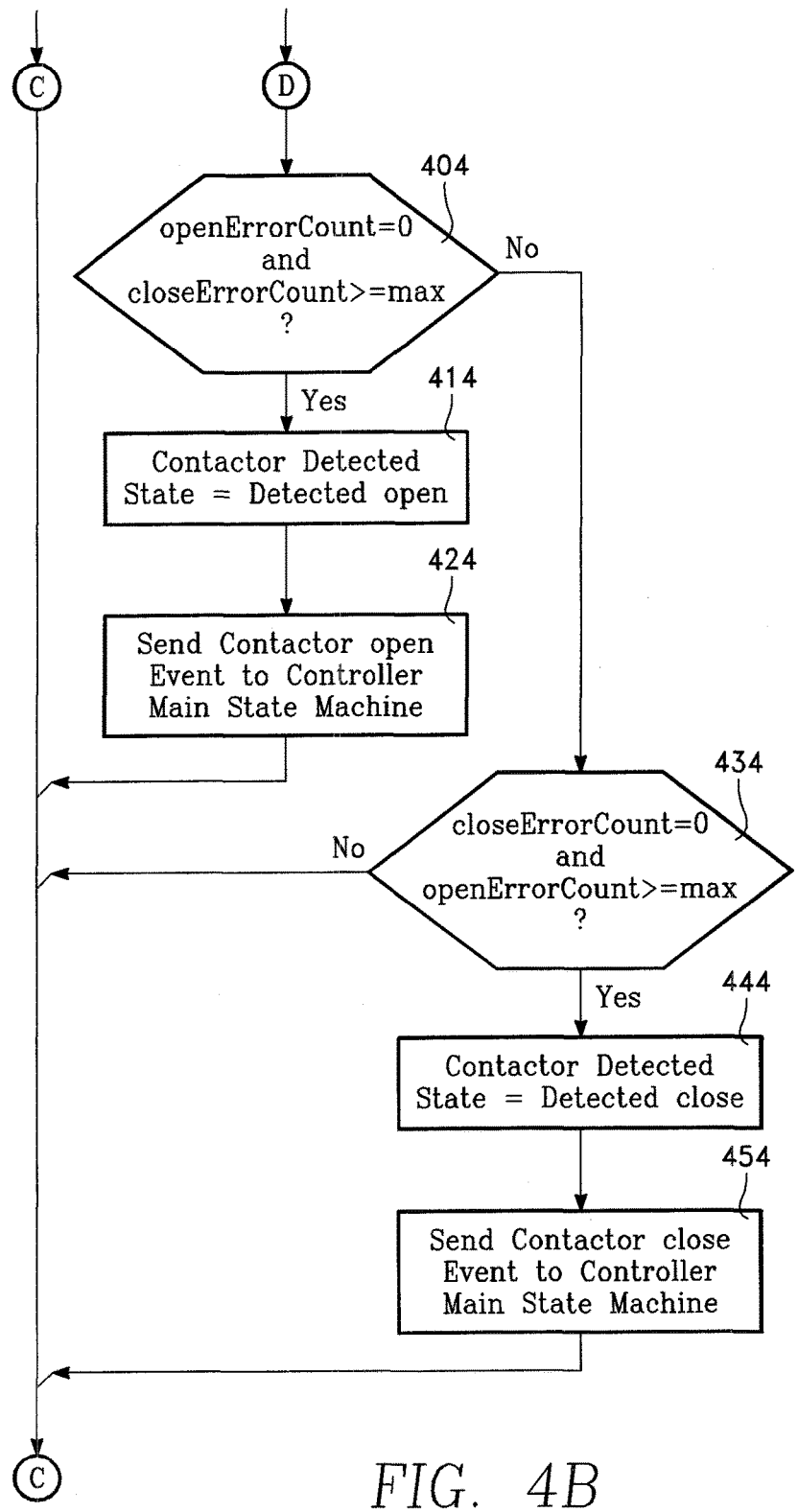
Figure 4C:
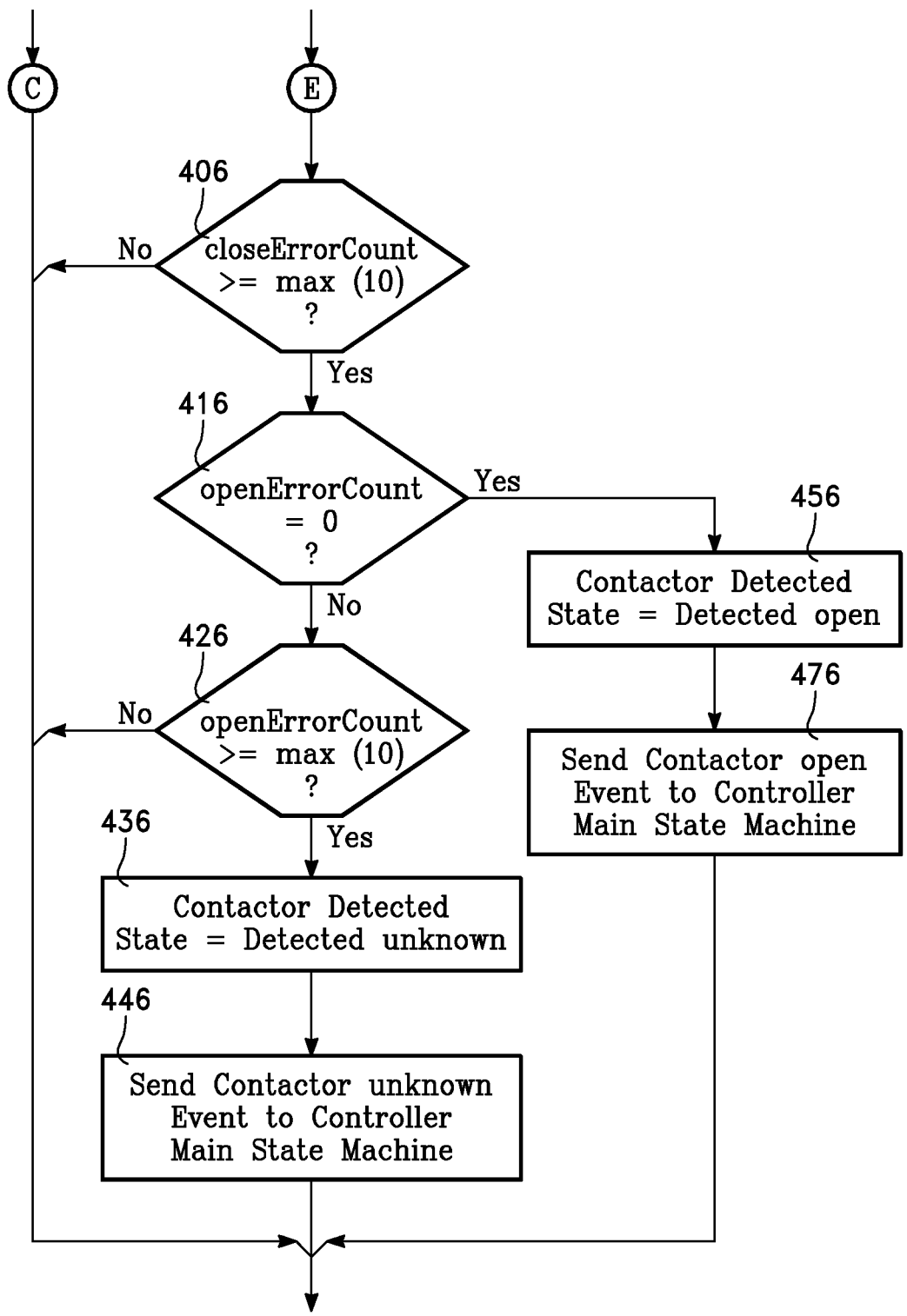

Shown in FIGS. 4A through 4C is a simplified flow chart diagram of an implementation of the update detected contactor state 230. There are three detected contactor states, and they are Detected Open, Detected Close, and Detected Unknown states. The states are updated according to the error counts. When both open and close error counts reach their max, for example 10, or min, for example 0, the detected contactor states are updated, and the contactor state change event is reported to the controller main state machine, i.e. the processor 50.

Referring to FIGS. 4A through 4C, if the contactor detected state is detected open in block 401 and the openErrorCount is greater than or equal to the maximum value, i.e. ten, at block 402, and the closeErrorCount is equal to the minimum value, i.e. zero, at block 412, then the contactor detected state is detected close as indicated in block 422. If the contactor detected state is detected close, a contactor close event is sent to the controller main state machine or processor 50 in block 432 and the contactor monitoring routine 200 (FIG. 2) continues to the controller main state machine section 240 detailed in FIG. 5.

If the contactor detected state is detected open in block 401 and the openErrorCount is greater than or equal to the maximum value in block 402, the contactor monitoring routine 200 continues to the controller main state machine section 240.

If the contactor detected state is detected open in block 401, and the openErrorCount is greater than or equal to the maximum value, i.e. ten, at block 402, and the closeErrorCount is not equal to zero at block 412, and the closeErrorCount is greater than or equal to the maximum value at block 442, the contactor detected state is detected unknown as shown in block 452. If the contactor detected state is detected unknown as shown in block 452, a contactor unknown event is sent to the controller main state machine or processor 50 in block 462 and the contactor monitoring routine 200 (FIG. 2) continues to the controller main state machine section 240 detailed in FIG. 5.

Figure 5:
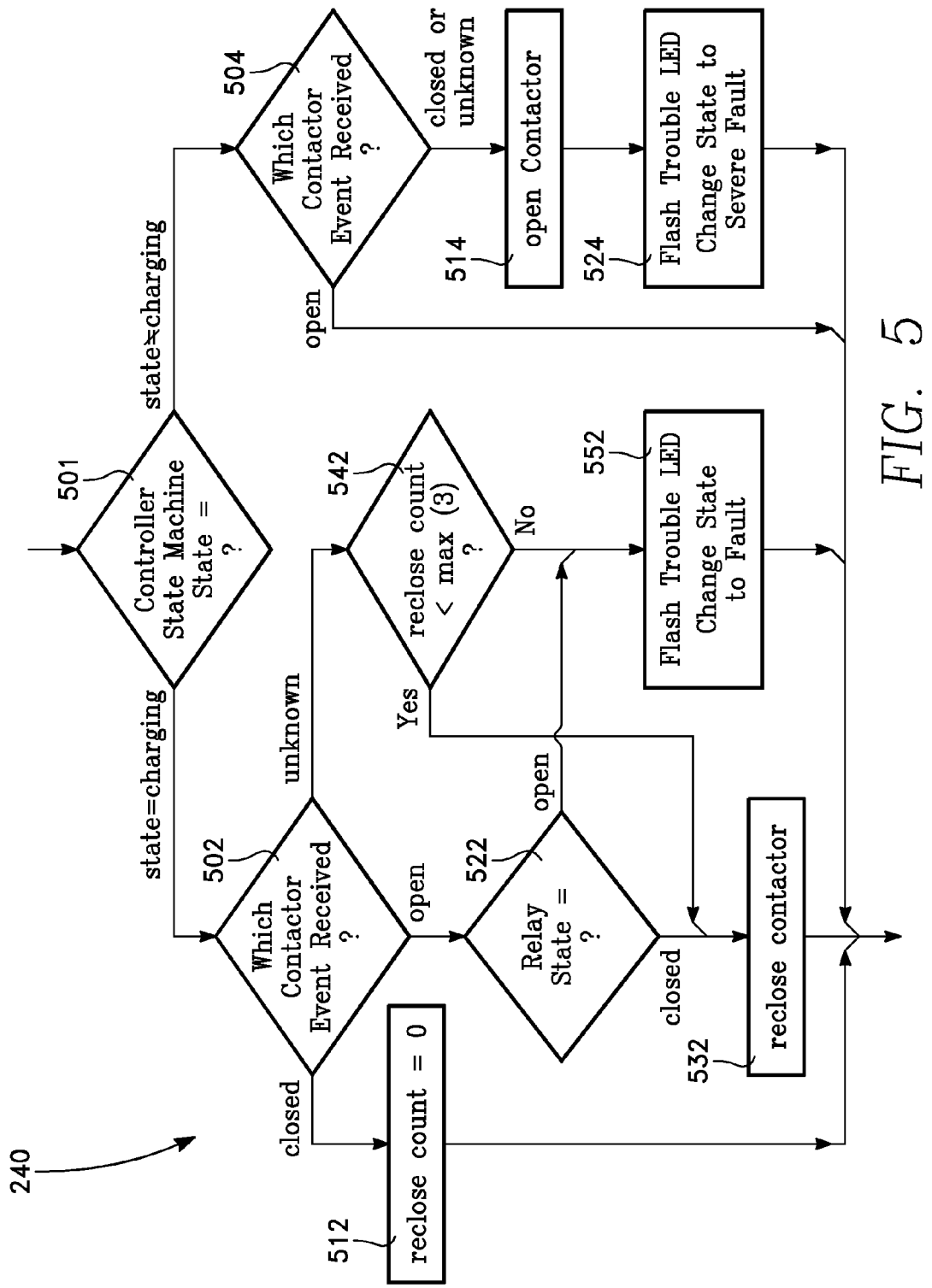
FIG. 5 is a simplified flow chart diagram of an implementation of the controller main state machine section of FIG. 2.

If the contactor detected state is detected open in block 401, and the openErrorCount is greater than or equal to the maximum value, i.e. ten, at block 402, and the closeErrorCount is not equal to zero at block 412, and the closeErrorCount is not greater than or equal to the maximum value at block 442, the contactor monitoring routine 200 (FIG. 2) continues to the controller main state machine section 240 detailed in FIG. 5.

In FIG. 4A, if the contactor detected state is detected open in block 401, and the openErrorCount is equal to zero and the closeErrorCount is greater than or equal to the maximum value in block 404, the contactor detected state is detected open as indicated in block 414. After the contactor detected state is detected open in block 414, a contactor open event is sent to the controller main state machine, i.e. processor 50, at block 424 and the contactor monitoring routine 200 (FIG. 2) continues to the controller main state machine section 240 detailed in FIG. 5.

If the contactor detected state is detected unknown in block 401 (indicated as path D to FIG. 4B), and either the openErrorCount is not equal to zero or the closeErrorCount is not greater than or equal to the maximum value in block 404 (FIG. 4B), and the closeErrorCount is equal to the minimum and the openErrorCount is greater than or equal to the maximum value at block 434, the contactor detected state is detected close as indicated in block 444. After the contactor detected state is detected close in block 444, a contactor close event is sent to the controller main state machine, i.e. processor 50, at block 454 and the contactor monitoring routine 200 (FIG. 2) continues to the controller main state machine section 240 detailed in FIG. 5.

If the contactor detected state is detected unknown in block 401 (indicated as path D to FIG. 4B), and either the openErrorCount is not equal to zero or the closeErrorCount is not greater than or equal to the maximum value in block 404, and either the closeErrorCount is not equal to the minimum or the openErrorCount is not greater than or equal to the maximum value at block 434, the contactor monitoring routine 200 (FIG. 2) continues to the controller main state machine section 240 detailed in FIG. 5.

If the contactor detected state is detected close in block 401 (indicated as path E to FIG. 4C), and the closeErrorCount is not greater than or equal to the maximum value, i.e. ten, at block 406, the contactor monitoring routine 200 (FIG. 2) continues to the controller main state machine section 240 detailed in FIG. 5.

If the contactor detected state is detected close in block 401 (indicated as path E to FIG. 4C), and the closeErrorCount is greater than or equal to the maximum value at block 406, and the openErrorCount is equal to the minimum, i.e. zero, at block 416, the contactor detected state is open as indicted at block 456. After the contactor detected state is detected open in block 456, a contactor open event is sent to the controller main state machine, i.e. processor 50, at block 476, the contactor monitoring routine 200 (FIG. 2) continues to the controller main state machine section 240 detailed in FIG. 5.

If the contactor detected state is detected close in block 401 (indicated as path E to FIG. 4C), and the closeErrorCount is greater than or equal to the maximum value at block 406, and the openErrorCount is not equal to the minimum, i.e. zero, at block 416 and the openErrorCount is not greater than or equal to the maximum value at 426, the contactor monitoring routine 200 (FIG. 2) continues to the controller main state machine section 240 detailed in FIG. 5.

If the contactor detected state is detected close in block 401 (indicated as path E to FIG. 4C), and the closeErrorCount is greater than or equal to the maximum value at block 406, and the openErrorCount is not equal to the minimum, i.e. zero, at block 416, and the openErrorCount is greater than or equal to the maximum value at 426, the contactor detected state is detected unknown at 436 and a contactor unknown event is sent to the controller main state machine at 446. Thereafter, the contactor monitoring routine 200 (FIG. 2) continues to the controller main state machine section 240 detailed in FIG. 5.

Shown in FIG. 5 is a simplified flow chart diagram of an implementation of the controller main state machine section 240 of FIG. 2. The main controller state machine is event driven. Detected contactor state change events may cause state change of the controller main state machine change.

Referring to FIG. 5, if the charging state at the controller state machine is indicated as charging, block 501, and the contactor event closed is received at block 502, the reclose count is zero, as expected and the contactor monitoring routine 200 (FIG. 2) completes the main state machine section 240.

If the contactor event open is received at block 502 and the relay state is detected closed, the contactor is reclosed block 532 and the contactor monitoring routine 200 (FIG. 2) continues. If the contactor is commanded closed but the relay state is detected as open at block 522, a visual indicator is provided, such as a flashing trouble LED on the user interface of the EVSE, to indicate to a user that a fault exists, block 552, and the contactor monitoring routine 200 (FIG. 2) completes the main state machine section 240.

If the contactor event unknown is received at block 502 and the reclose count is less than a maximum, i.e. three, at block 542, the contactor is reclosed block 532 and the contactor monitoring routine 200 (FIG. 2) completes the main state machine section 240. Thus, if the state machine is in a charging state at 501 and an unknown event is received at 502, the state machine will attempt three times in this example (if at 542 the reclose count is less than maximum of three in this example) to reclose the contactor at 532.

If the reclose count is not less than the maximum, i.e. three, at block 542, the visual indicator is provided, such as a flashing trouble LED on the user interface of the EVSE, to indicate to a user that a fault exists, block 552, and the contactor monitoring routine 200 (FIG. 2) completes the main state machine section 240.

If the charging state at the controller state machine is indicated as not charging, block 501, and the contactor event open is received at block 504, the contactor monitoring routine 200 (FIG. 2) completes the main state machine section 240. If either the contactor event closed, or the contactor event unknown is received at block 504, the contactor is commanded to open at block 514 and the visual indicator is provided, such as the flashing trouble LED on the user interface of the EVSE, to indicate to a user that a severe fault exists, block 524, and the pilot signal is set to −12V. Thereafter, the contactor monitoring routine 200 (FIG. 2) completes the main state machine section 240.

As discussed above, the contactor monitoring function includes three sections, the contactor error count update section 220, the detected contactor state update section 230, and the controller main state machine section 240. The contactor error count update has two error counts used in this design, and they openErrorCount and closeErrorCount.

In the contactor error count update section 220, the openErrorCount is utilized to count the contactor open error (default as 0). If the contactor is detected to be not in open state, this count increased by 1. The closeErrorCount is utilized to count the contactor close error (default as max=10). If the contactor is detected at being not in the close state, this count increased by 1.

In one implementation, the contactor error count update may be implemented in pseudo code as follows:

```
If Vo1 and Vo2 < open threshold, then:
  Open condition satisfied:
    openErrorCount −1 (if>0)
    closeErrorCount +1 (if<max) (16ms*10, for
    25ms open/close time)
  else if abs (Vi-Vo) < delta, then:
    Close condition satisfied:
      closeErrorCount −1 (if>0)
      openErrorCount +1 (if<max)
  else
    Unknow condition:
      openErrorCount +1 (if<max)
      closeErrorCount +1 (if<max)
```

Next the contactor state is identified as Detected Open, Close, or Unknown. The pseudo code to detect these states are as follows:

```
Contactor Detected Close:
  If openErrorCount >= max
  If closeErrorCount = 0
    Contactor Close state detected:
    Contactor Close Event sent to main state
    machine
  Else if closeErrorCount >= max
    Contactor Unknown state detected:
    Contactor Unknown Event sent to main state
    machine
Contactor Detected Open:
  If closeErrorCount >= max
  If openErrorCount = 0
    Contactor Open state detected:
```

```
            Contactor Open Event sent to main state
        machine
        Else if openErrorCount >= max
            Contactor Unknown state detected:
            Contactor Unknown Event sent to main state
        machine
    Contactor Detected Unknown:
        If (openErrorCount = 0) & (closeErrorCount >= max)
            Contactor Open state detected:
            Contactor Open Event sent to main state machine
        Else if (closeErrorCount = 0) & (openErrorCount >=
        max)
            Contactor Close state detected:
            Contactor Close Event sent to main state
    machine
```

Next, the main controller state is event driven so a detected contactor state change event may cause state machine change its state as follows in pseudo code:

```
    In Charging State:
        if Detected Closed Event received:
            As expected
            recloseCount = 0
        else if Detected Open Event received:
            If commanded close but relay control open
                Fault condition:
                Flash Trouble LED and go to fault state
            Else (commanded close and relay control close)
                Something caused open:
                Retry to close the contactor
        else if Detected Unknown Event received:
            If recloseCount < max
                Retry to close contactor (no load
        condition)
            Else max retry reached
                Fault condition:
                Flash Trouble LED and go to fault state
    In States other than Charging:
        If Detected Open Event received:
            As expected
        Else if Detected Close or Unknown Event received:
            Contactor has not commanded close but detected
            not open:
            Open contactor
            Set pilot -12V, LED contactor fault
            State change to severe fault
```

Some advantages of various implementations are that the contactor state is constantly monitored so if a stuck close condition is identified, the software will try to re-open the contactor, flash the Trouble LED to indicate the welded contactor, and go to Severe Fault state to wait for power recycle of the EVSE. Also, if a stuck open condition is identified, the software will try to re-close the contactor at least three times before flash Trouble LED to indicate contactor fault, and go to fault state. Various implentations allow the contactor state to be properly managed to ensure improved reliability and safety of EVSE products.

Another advantage of various implementations is that the open and close error counts help to ensure that there are no false fault indications when the contactor is being closed. When the contactor is transitioned to closed, there can be a settling time, where the contactor physically bounces before coming to rest as it settles in the closed position. This normal settling could otherwise cause a fault condition as the contactor opens and closes before coming to rest in the closed position.

In some implementations a least mean squares curve fit is employed to calculate Vin and Vout from the detected samples. This gives less error indications for error counting.

Yet another advantage of various implementations is that independent contactor state detection is provided based on Vin and Vout, with the state change being reported as event to the main state machine.

As such, various implementations and embodiments ensure improved reliability and safety of EVSE products.

The minimum, maximum, threshold, and delta values may be different in various implementations than the example values provided. In one example implementation, a contactor typically closes in 25 msec. Thus, if the main state machine clock cycle is 16 msec, the contactor typically closes within two cycles. Most all contactors close within four to five state machine cycles. Thus, in the example above the maximum value for the open error count and close error count is selected as double the anticipated close time for most any contactor utilized, to ensure no false error indications. A maximum value for the open error count and/or close error count could be selected that is less, or even greater than ten, depending on the clock cycle of the state machine and the close time and tolerances of the contactor and associated circuitry. Similarly, the example threshold and delta voltage values can be different than those discussed above, depending on the characteristics of the line voltage and associated circuitry under normal and extreme conditions.

It is worthy to note that any reference to "one embodiment or implementation" or "an embodiment or implementation" means that a particular feature, structure, or characteristic described in connection with the embodiment/implementation may be included in an embodiment/implementation, if desired. The appearances of the phrase "in one embodiment or implementation" in various places in the specification are not necessarily all referring to the same embodiment/implementation.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

Having described this invention in connection with a number of embodiments, modification will now certainly suggest itself to those skilled in the art. The example embodiments herein are not intended to be limiting, various configurations and combinations of features are possible. As such, the invention is not limited to the disclosed embodiments, except as required by the appended claims.

What is claimed is:

1. A method for contactor monitoring and control in electric vehicle supply equipment, the method comprising:
   a) updating contactor error counts based on a detected condition of a contactor comprising:
      i) updating an open error count; and
      ii) updating a close error count;
   b) determining a detected state of the contactor by comparing the open error count and the close error count to maximum and minimum values; and
   c) performing at least one of: (i) controlling the state of the contactor based on the determined contactor state; or (ii) providing a visual indicator based on the determined contactor state.

2. The method of claim 1, wherein updating contactor error counts comprises:
   a) detecting contactor input line voltages and comparing each of the contactor input line voltages to a threshold; and
   b) detecting a combined contactor input line voltage and contactor combined output line voltage and comparing the contactor input line voltage with contactor output line voltage to a delta value.

3. The method of claim 1 further comprising detecting a condition of the contactor by comparing voltages at outputs of the contactor to a threshold value.

4. The method of claim 3, wherein detecting the condition comprises determining an open condition is satisfied when the voltages at the outputs of the contactor are both less than the threshold value.

5. The method of claim 3, wherein detecting the condition comprises determining a close condition is satisfied when either of the voltages at the outputs of the contactor are greater than the threshold value and the absolute value of a difference between an input voltage less an output voltage of the contactor is less than a delta value.

6. The method of claim 3, wherein detecting the condition comprises determining an unknown condition is satisfied when either of the voltages at the outputs of the contactor are greater than the threshold value and the absolute value of a difference of an input voltage less an output voltage of the contactor is not less than a delta value.

7. The method of claim 1, wherein updating contactor error counts comprises:
   a) decrementing the open error count when the detected condition of the contactor is open and the open error count is greater than zero; and
   b) incrementing the close error count when the detected condition of the contactor is open and the close error count is less than a maximum value.

8. The method of claim 1, wherein updating contactor error counts comprises:
   a) decrementing the close error count when the detected condition of the contactor is close and the close error count is greater than zero; and
   b) incrementing the open error count when the detected condition of the contactor is close and the open error count is less than a maximum value.

9. The method of claim 1, wherein updating contactor error counts comprises:
   a) incrementing the open error count when the detected condition of the contactor is unknown and the open error count is less than a maximum; and
   b) incrementing the close error count when the detected condition of the contactor is unknown and the close error count is less than a maximum.

10. The method of claim 1, wherein controlling the state of the contactor comprises reclosing the contactor when in a charging state and when a contactor open event is received and a contactor control relay is closed.

11. The method of claim 1, wherein performing comprises providing a visual indicator of a fault when in a charging state and when a contactor open event is received and a contactor control relay is open.

12. The method of claim 1, wherein performing comprises providing a visual indicator of a fault when in a charging state and when a contactor unknown event is received and a reclose count is not less than a maximum.

13. The method of claim 1, wherein performing comprises providing a visual indicator of a fault when in a charging state and when a contactor unknown event is received and a reclose count is not less than a maximum value.

14. The method of claim 1, wherein performing comprises controlling the state of the contactor by reclosing the contactor when in a charging state and when a contactor unknown event is received and a reclose count is less than a maximum value.

15. The method of claim 1, wherein performing comprises providing a visual indicator of a fault and sending an opening to the contactor when not in a charging state and when one of: (a) a contactor closed event; or (b) a contactor unknown event is received.

16. The method of claim 1, further comprising communicating the detected state of the contactor to a main state machine, and wherein performing comprises using the main state machine to perform the at least one of: (i) controlling the state of the contactor based on the determined contactor state; or (ii) providing a visual indicator based on the determined contactor state.

17. A method for contactor monitoring and control in electric vehicle supply equipment, the method comprising:
   a) updating contactor error counts based on a detected condition of a contactor comprising:
      i) updating an open error count; and
      ii) updating a close error count;
   b) determining a detected state of the contactor by comparing the open error count and the close error count to maximum and minimum values;
   c) performing at least one of: (i) controlling the state of the contactor based on the determined contactor state; or (ii) providing a visual indicator based on the determined contactor state and
   d) wherein determining a detected state of the contactor comprises determining the detected state is one of (i) closed when the open error count is greater than or equal to a maximum value and the close error count is equal to a minimum value; (ii) unknown when the open error count is greater than or equal to a maximum value and the close error count is greater than or equal to a maximum value; or (iii) open when the open error count is equal to a minimum value and the close error count is greater than or equal to a maximum value.

18. The method of claim 17, further comprising: (a) communicating a contactor close event to a controller main state machine if the detected state of the contactor is closed; (b) communicating a contactor unknown event to a controller main state machine if the detected state of the contactor is unknown; or (c) communicating a contactor open event to a controller main state machine if the detected state of the contactor is open.

19. The method of claim 17, wherein updating contactor error counts comprises:
   a) detecting contactor input line voltages and comparing each of the contactor input line voltages to a threshold; and
   b) detecting a combined contactor input line voltage and contactor combined output line voltage and comparing the contactor input line voltage with contactor output line voltage to a delta value.

20. The method of claim 17 further comprising detecting a condition of the contactor by comparing voltages at outputs of the contactor to a threshold value, and wherein detecting the condition comprises determining one of: (a) an open condition is satisfied when the voltages at the outputs of the contactor are both less than the threshold value; (b) a close condition is satisfied when either of the voltages at the outputs of the contactor are greater than the threshold value and the absolute value of a difference between an input voltage less an output voltage of the contactor is less than a delta value; or (c) an unknown condition is satisfied when either of the voltages at the outputs of the contactor are greater than the threshold value and the absolute value of a difference of an input voltage less an output voltage of the contactor is not less than a delta value.

* * * * *